(12) United States Patent
Collins, III et al.

(10) Patent No.: US 6,576,488 B2
(45) Date of Patent: Jun. 10, 2003

(54) USING ELECTROPHORESIS TO PRODUCE A CONFORMALLY COATED PHOSPHOR-CONVERTED LIGHT EMITTING SEMICONDUCTOR

(75) Inventors: William David Collins, III, San Jose, CA (US); Michael R. Krames, Mountain View, CA (US); Godefridus Johannes Verhoeckx, Fontanalaan (NL); Nicolaas Joseph Martin van Leth, Hout Vester (NL)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/879,627

(22) Filed: Jun. 11, 2001

(65) Prior Publication Data

US 2002/0187571 A1 Dec. 12, 2002

(51) Int. Cl.$^7$ ............................................. H01L 21/00
(52) U.S. Cl. ............................. 438/29; 438/22; 438/26; 257/98
(58) Field of Search ............................ 438/22, 25, 26, 438/27, 29; 257/13, 97, 98; 313/501

(56) References Cited

U.S. PATENT DOCUMENTS

| | | | |
|---|---|---|---|
| 4,482,447 A | * | 11/1984 | Mizuguchi et al. ......... 204/181 |
| 5,296,117 A | * | 3/1994 | De Jaeger et al. ....... 204/181.5 |
| 5,813,753 A | * | 9/1998 | Vriens et al. ............... 362/293 |
| 5,952,681 A | * | 9/1999 | Chen .......................... 257/89 |
| 6,090,434 A | * | 7/2000 | Sugiura et al. ............... 427/64 |
| 6,203,681 B1 | * | 3/2001 | Yang ........................... 204/489 |
| 6,245,259 B1 | * | 6/2001 | Hohn et al. ............ 252/301.36 |
| 6,373,188 B1 | * | 4/2002 | Johnson et al. ............... 257/94 |

FOREIGN PATENT DOCUMENTS

| | | | |
|---|---|---|---|
| JP | 55-46407 | * | 4/1980 |
| WO | WO 97/48138 | * | 12/1997 |
| WO | WO 00/24024 | * | 4/2000 |

OTHER PUBLICATIONS

K. Murakami, et al., "Compound semiconductor lighting based on InGaN ultraviolet LED and ZnS phosphor system," 2000 IEEE International Symposium on Compound Semiconductors, 2000, pp. 449–454.*

* cited by examiner

Primary Examiner—Amir Zarabian
Assistant Examiner—Jeff Vockrodt
(74) Attorney, Agent, or Firm—Patent Law Group LLP; Rachel V. Leiterman; Brian D. Ogonowsky

(57) ABSTRACT

Presented is a method of conformally coating a light emitting semiconductor structure with a phosphor layer to produce a substantially uniform white light. A light emitting semiconductor structure is coupled to a submount, a first bias voltage is applied to the submount, and a second bias voltage is applied to a solution of charged phosphor particles. The charged phosphor particles deposit on the conductive surfaces of the light emitting semiconductor structure. If the light emitting semiconductor structure includes a nonconductive substrate, the light emitting semiconductor structure is coated with an electroconductive material to induce phosphor deposition. The electrophoretic deposition of the phosphor particles creates a phosphor layer of uniform thickness that produces uniform white light without colored rings.

28 Claims, 12 Drawing Sheets

USING ELECTROPHORESIS TO PRODUCE A CONFORMALLY COATED PHOSPHOR-CONVERTED LIGHT EMITTING SEMICONDUCTOR

CROSS-REFERENCE TO A RELATED APPLICATION

This application is related to application Ser. No. 09/879,547 titled "Phosphor-Converted Light Emitting Device" by William David Collins III et al., which is filed on the same date as this application and incorporated herein by reference.

BACKGROUND OF THE INVENTION

1. Field of the Invention

The present invention relates generally to light emitting devices and more particularly to light emitting semiconductor structures coated with phosphor.

2. Description of Related Art

Light emitting diodes (LEDs) are p-n junction devices that convert an incoming flow of electric energy into an outgoing flow of electromagnetic radiation. LEDs emit electromagnetic radiation in ultraviolet, visible, or infrared regions of the electromagnetic spectrum. The light emitted by an LED is distributed across a spectrum that is approximately 20–40 nm wide and has a peak emission wavelength defined by design details such as the crystal composition. As a consequence of the peak emission wavelength, a single LED p-n junction cannot emit white light, which is composed of spectral contributions from almost the entire wavelength range of the visible spectrum.

FIG. 1 shows an example of a white light emitting device including an LED and phosphor. LEDs that emit blue light are used with phosphors (luminescent material) to produce light emitting devices which emit apparently white light. U.S. Pat. Nos. 5,813,753 and 5,998,925, for example, disclose light emitting devices in which a blue LED is disposed in a reflective cup and surrounded by material including phosphors. In the exemplary device of FIG. 1, a portion of the blue light emitted by LED chip 10 and the red and the green light emitted by the phosphors as a result of a partial absorption of the blue light can combine to produce white light.

Usually, white light generated by sources such as the device illustrated in FIG. 1 is not uniform in color. For example, the generated white light may be surrounded by colored rings. This nonuniformity is a consequence of the variations in the thickness of the phosphor-containing material surrounding LED chip 10. The variations in the thickness cause spatially nonuniform absorption of blue light and emission of red and green light. In particular, thick regions of phosphor containing material absorb more blue light and emit more red and green light than do thin regions of phosphor containing material. The light from thick regions thus tends to appear yellow or display reddish and greenish blotches, and the light from thin regions tends to appear bluish. As illustrated in FIG. 1, light emitted in path b travels much further through the phosphor than light emitted in path a. When light strikes a phosphor particle, the light is either absorbed and re-emitted at a different wavelength or scattered by the phosphor. Light that travels a longer distance through the phosphor-bearing layer is more likely to be absorbed and re-emitted. Conversely, light that travels a shorter distance through the phosphor-bearing layer is more likely to be scattered out of the device without being absorbed and re-emitted. As a result, more blue light is emitted from regions of the device corresponding to short path lengths through the phosphor, and more red and green light or amber light is emitted from regions of the device corresponding to long path lengths through the phosphor.

FIG. 2 shows an exemplary attempt to counter the problem of nonuniformity of white light. The particular attempt involves an arrangement of a mass of phosphor containing encapsulant within a package or a phosphor loaded optical element interposed in the light exit path of the blue light LED within an extended package. For example, U.S. Pat. No. 5,959,316 to Lowery entitled "Multiple Encapsulation of Phosphor-LED Devices," which is incorporated herein by reference, proposes depositing a transparent spacer over and around the LED prior to deposition of a uniform thickness of phosphor containing material. However, surface tension makes the shape and thickness of the phosphor containing material, often deposited as a liquid or paste (solids dispersed in a liquid), difficult to control. In addition, phosphor layer 6 must be separated from LED chip 10. As a result, the effective size of the light emitting device, i.e., the combined size of the LED chip and the phosphor layer, is much larger than the size of the LED chip alone. Since the optics used to control the light emitted from the source can grow geometrically with the source size, the large source size proposed by Lowery can present implementation difficulties. A method of producing uniform white light from LEDs without the implementation difficulties of the previous methods is needed.

SUMMARY

The present invention provides a method of conformally coating a light emitting semiconductor structure, such as an LED chip, with a phosphor layer. The method involves electrically coupling a light emitting semiconductor structure to a submount, applying a first bias voltage to the submount, and applying a second bias voltage to a solution of charged phosphor particles. The electric field created by the two bias voltages induces the phosphor particles to deposit on the conductive surfaces. For example, the submount and the light emitting semiconductor structure coupled to the submount may be immersed in a solution of phosphor particles. In some embodiments, the solution may also contain a binder material that helps phosphor particles securely adhere to the conductive surfaces and to each other, and/or a charging agent that helps charge the phosphor particles.

If the light emitting semiconductor structure includes a conductive substrate, deposition of the phosphor layer can be limited to the surfaces of the light emitting device by coating the submount surface with an insulating layer before bringing all surfaces in contact with charged phosphor particles. If the light emitting semiconductor structure includes a nonconductive substrate, a conductive layer may be created on the surfaces where phosphor deposition is desired before the insulating layer is selectively deposited. The conductive layer may be created after the light emitting semiconductor structure is coupled to the submount. Alternatively, creating the conductive layer on the surfaces of the light emitting semiconductor structure can be completed as a part of the light emitting semiconductor structure fabrication process, before coupling the light emitting semiconductor structure to the submount. After creating the conductive layer and selectively depositing the insulating layer, the surfaces of the submount and the light emitting semiconductor structure are exposed to the solution of phosphor particles.

The electrophoretic deposition creates a phosphor layer of uniform thickness on all conductive surfaces which are electrically biased and put in contact with the solution of phosphor particles. In one embodiment, the uniform thickness phosphor layer produces uniform white light.

DETAILED DESCRIPTION

As used herein, "LED chip" and "light emitting semiconductor structure" refer to a stack of semiconductor layers, including an active region which emits light when biased to produce an electrical current flow through the device, and contacts attached to the stack. If a substrate on which the semiconductor layers are grown is present, "LED chip" includes the substrate. "Phosphor" refers to any luminescent materials which absorb light of one wavelength and emits light of a different wavelength, and "light emitting device" refers to an LED chip coated with a layer, for example a phosphor layer, through which the emitted light passes. "Submount," used herein, refers to a secondary support substrate other than the substrate on which the epitaxial layers of an LED chip are grown. Submount 28 but is not limited to a micro-machined silicon wafer with integrated devices such as ESD protection clamp diodes and a metallization layer.

Figure 1:
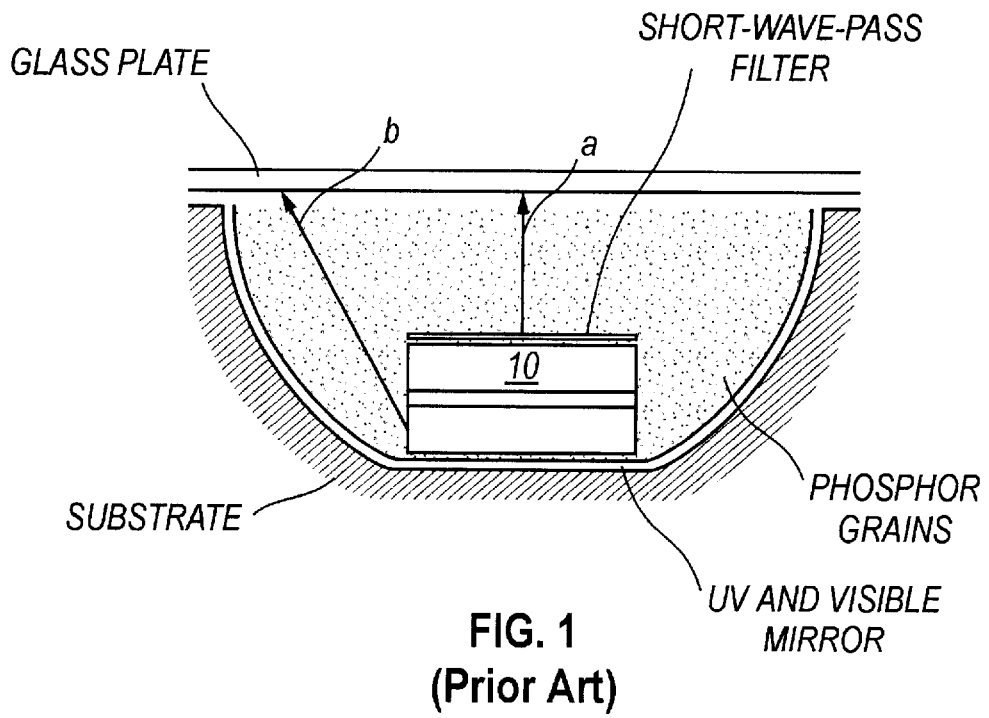
FIG. 1 depicts an LED encapsulated in a material containing phosphor.
Figure 2:
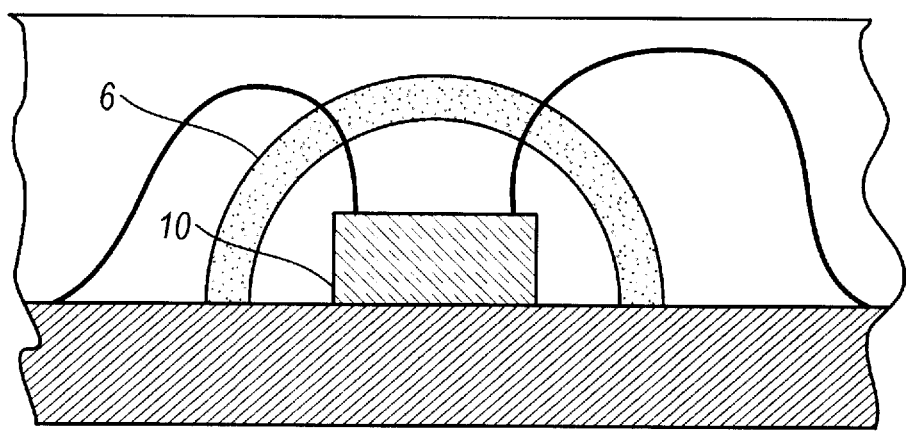
FIG. 2 depicts an LED separated from a phosphor layer by a transparent spacer.
Figure 3A:
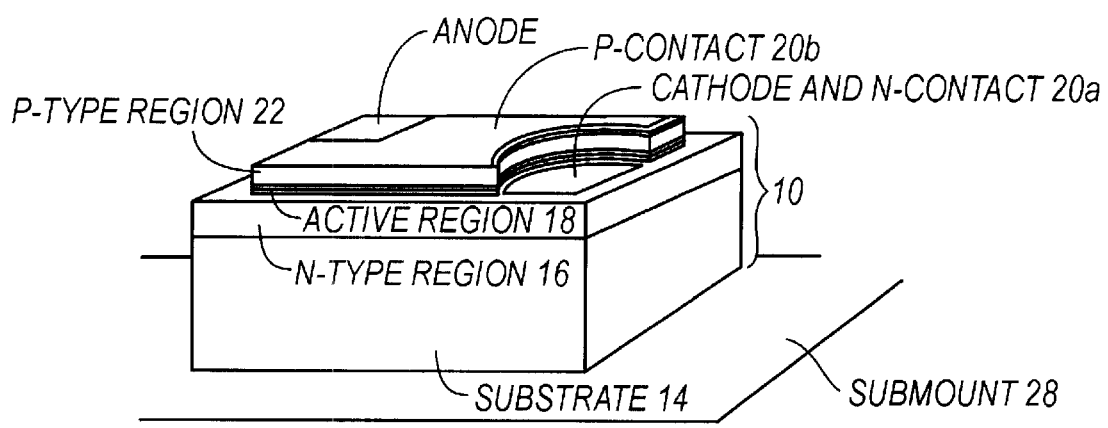
FIG. 3A, FIG. 3B, and FIG. 3C depict LEDs of different configurations to which the electrophoretic deposition method of the present invention can be applied.
Figure 3B:
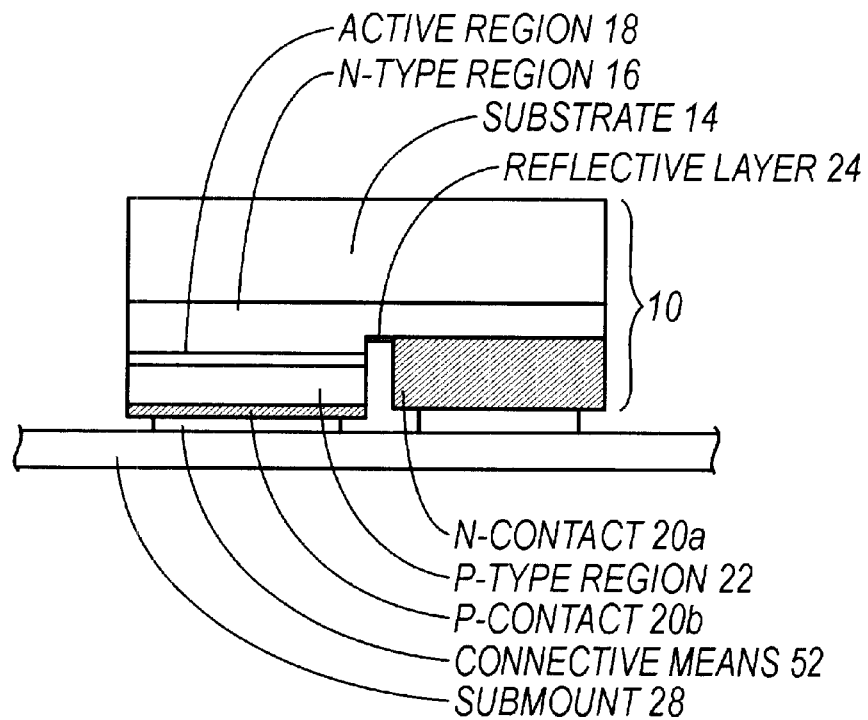
Figure 3C:
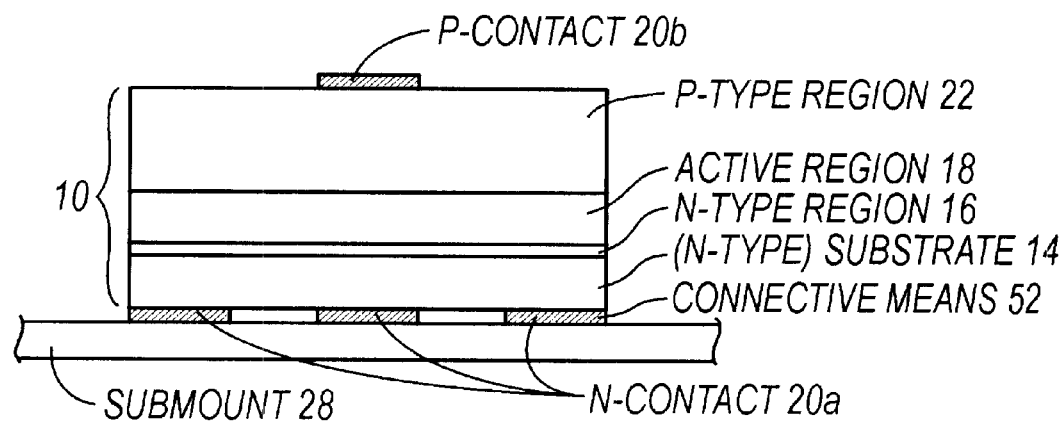

FIG. 3A, FIG. 3B, and FIG. 3C each depict an exemplary configuration of LED chip 10 to which the electrophoretic phosphor deposition process may be applied in accordance with the present invention. LED chip 10 includes an n-type region 16 formed on a substrate 14. Substrate 14 may include a nonconductive material such as sapphire, undoped silicon carbide (SiC), undoped III-nitride, or an undoped II–VI material. Alternatively, substrate 14 may include a conductive material such as doped SiC, doped III-nitride, or a doped II–VI material. An active region 18 is formed on the n-type region 16, and a p-type region 22 is formed on the active region 18. N-type region 16, active region 18, and p-type region 22 are typically multiple layer structures of materials having the general formula $Al_xGa_yIn_{1-x-y}N$ ($0 \leq x \leq 1, 0 \leq y \leq 1, 0 \leq x+y \leq 1$), and may further contain group III elements such as boron and thallium. Sometimes, the nitrogen may be replaced by phosphorus, arsenic, antimony, or bismuth. In some embodiments, n-type region 16, active region 18, and p-type region 22 may be composed of a II–VI material. A portion of the p-type region 22, the active region 18, and the n-type region 16 is etched away to expose a portion of n-type region 16. P-contact 20b is deposited on the p-type region 22 and n-type contact 20a is deposited on the exposed portion of n-type region 16. LED chip 10 is mounted on a submount 28 by a connective means 52. Connective means 52 may be any conventional adhesive or metal bumps such as solder, gold, or aluminum bumps, and is referred to as metal bumps 52 in the examples provided. LED chip 10 causes light to exit through all surfaces except the surfaces which are attached to submount 28, obstructed b a metallization, or obstructed b a reflective layer.

FIG. 3A depicts an exemplary LED chip 10 to which the selective electrophoretic deposition process of the present invention can be applied. LED chip 10 shown in FIG. 3A has epitaxial layers of at least n-type region 16, p-type region 22, and active region 18 grown on substrate 14, and n-type contact 20a and p-type contact 20b both placed on the same side of LED chip 10. The epitaxial layers through which current flows from p-type contact 20b to n-type contact 20a are attached to substrate 14. In some embodiments, substrate 14 may include submount 28. Current flows laterally through the conductive epitaxial layers. P-type contact 20b may be made of a semitransparent material in order to enhance light extraction.

FIG. 3B depicts LED chip 10 of another configuration to which the electrophoretic deposition process of the present invention can be applied. As in the configuration depicted in FIG. 3A, n-contact 20a and p-contact 20b are placed on the same side of LED chip 10. Current flows laterally from p-contact 20b through p-type region 22 before flowing vertically through n-type region 16 and n-contact 20a. Some embodiments include a reflective layer 24 attached to a surface of LED chip 10 that is proximate to submount 28, to redirect photons traveling toward submount 28 out of LED chip 10.

FIG. 3C depicts LED chip 10 of a different configuration to which the selective electrophoretic deposition process of the present invention can be applied. LED chip 10 of FIG. 3B has n-contact 20a and p-contact 20b attached to opposite sides of the semiconductor layers in LED chip 10, unlike the configurations in FIG. 3A and FIG. 3B. Current flows vertically through the semiconductor layers between the two contacts. Substrate 14 of the configuration in FIG. 3C includes an electrically conductive material, such as n-doped SiC. Although FIG. 3C shows LED chip 10 to be cubic, the present invention can be applied to LED chips of all shapes, for example the inverted truncated pyramid structure disclosed in U.S. Pat. No. 6,229,160 to Michael R. Krames, et al titled "Light Extraction from a Semiconductor Light-Emitting Device via Chip Shaping," which is herein incorporated by reference. LED chip 10 is mounted on submount 28.

FIG. 4A through FIG. 4E each depicts a stage of a selective electrophoretic phosphor deposition process that conformally coats an LED chip 10 including a conductive substrate. Examples of phosphors suitable for the present invention include but are not limited to strontium sulfide compounds, yttrium aluminum garnet compounds doped with gadolinium, cerium, or praseodymium, strontium thiogallate compounds, and microbeads of polymer containing various organic luminescent dyes. Selective electrophoretic deposition process can be carried out with an array of LEDs on a submount, or on an individual LED. For clarity of illustration, FIG. 4A through FIG. 4E show two LED chips of a wafer, each LED chip 10 having the configuration shown in FIG. 3B.

Figure 4A:
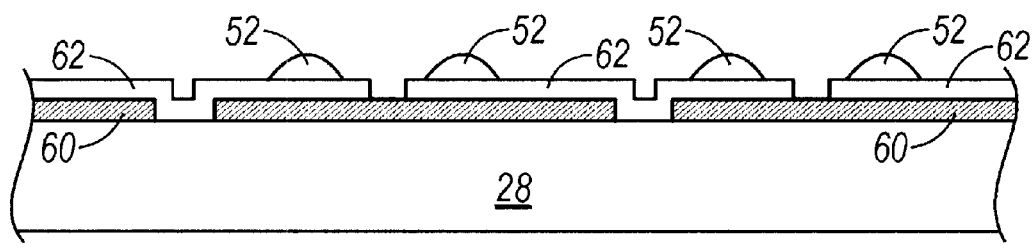
FIG. 4A through FIG. 4E depict conformal coating of an LED which includes a conductive substrate using an electrophoretic deposition method according to the present invention.

FIG. 4A depicts a stage of the electrophoretic deposition process whereby submount 28 is coated with an insulating layer 60. In some embodiments, insulating layer 60 may be a part of submount 28. A contact layer 62, such as a layer of Ag or Al, is deposited on insulating layer 60, and metal bumps 52 are formed on contact layer 62. Metal bumps 52 may be made of, for example, gold, solder, or aluminum. Contact layer 62 covers substantially the entire surface of submount 28 except metal bumps 52 and the spaces necessary to keep the anode contacts separate from the cathode contacts.

Figure 4B:
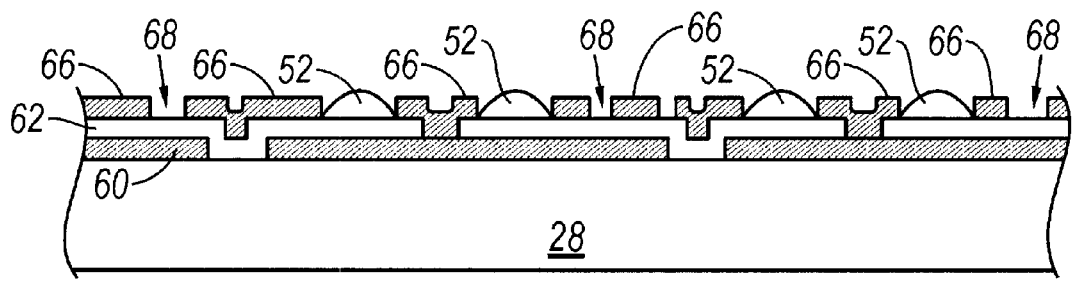

FIG. 4B depicts a stage whereby a second insulating layer 66 is deposited in the gaps between anode contacts and cathode contacts and on parts of contact layer 62. The parts of contact layer 62 that are not coated with second insulating layer 66 form contact windows 68. Contact windows 68 are used for making interconnections to other electrical devices, for example by using wire bonds. The insulating layers may be transparent. Examples of material suitable for insulating layers 60 and 66 include $Al_nO_m$, $SiO_x$, $Si_3N_4$, organic materials such as polyimide or poly methyl methacrylate, or combinations thereof.

Figure 4C:
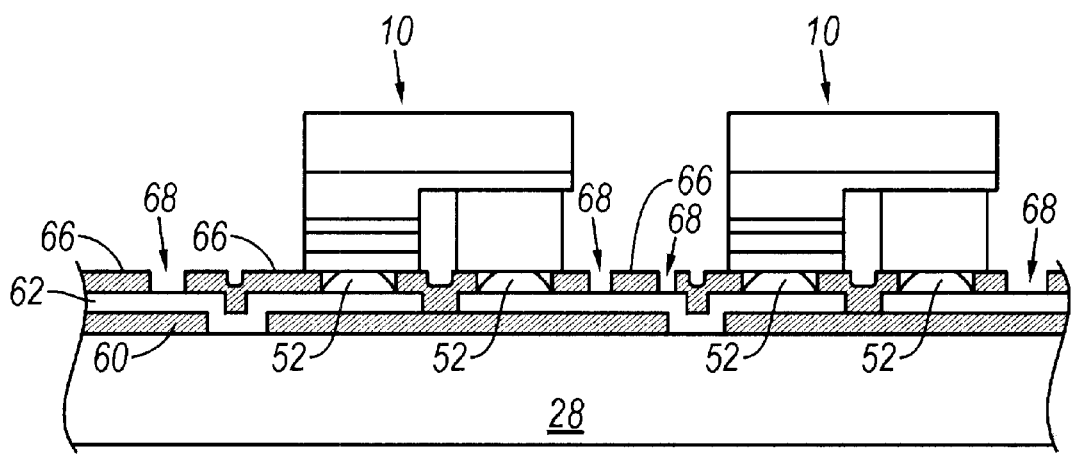

FIG. 4C depicts a stage whereby an exemplary array of LED chip 10, fabricated in a separate process using any of the conventional methods, are placed on and bonded to metal bumps 52. N-contact 20a and p-contact 20b of the LED chip 10 may be fabricated as reflective structures so as to direct a greater portion of the emitted light away from the surface attached to submount 28, allowing more light to escape LED chip 10. Any of the conventional thermally and electrically conductive attach methods, such as soldering, may be employed to fix LED chip 10 to submount 28.

Figure 4D:
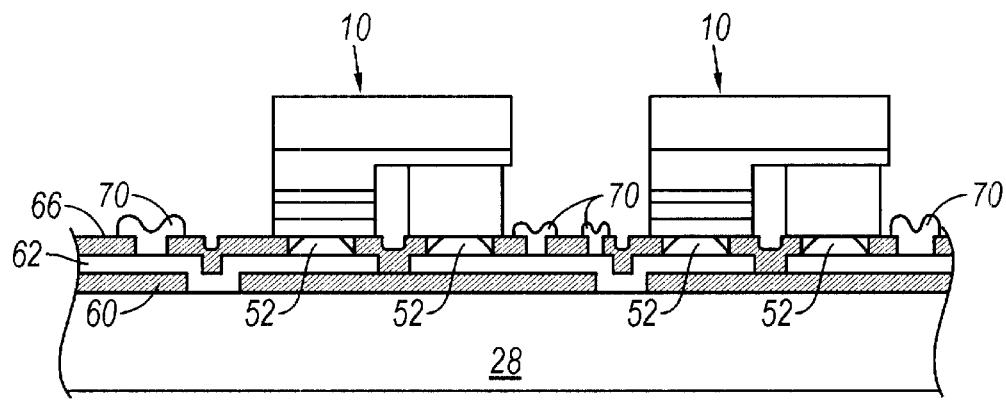

FIG. 4D depicts a stage whereby a photoresist 70 and a mask (not shown) are applied to the submount. The mask (not shown) is patterned to clear all the LED chip surfaces and all other surfaces of the submount, leaving only the electrical contact windows 68 covered by an insulating layer of photoresist 70. After photoresist 70 is selectively cleared, the only conductive surfaces on submount 28 are the surfaces of LED chip 10 and parts of metal bumps 52 that do not contact LED chip 10.

Figure 4E:
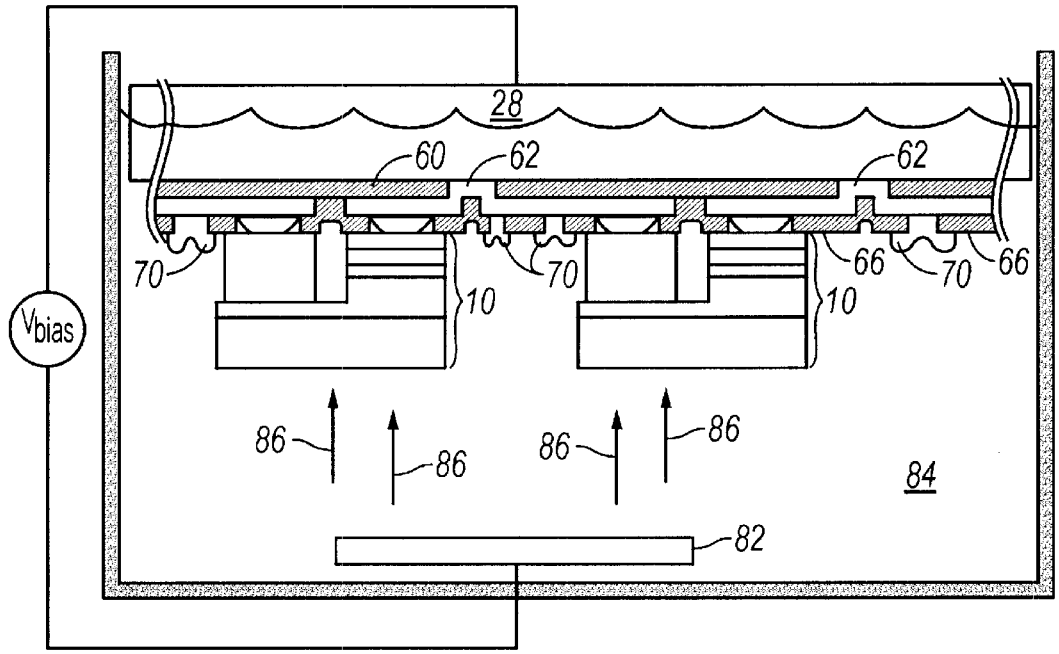

FIG. 4E depicts a stage whereby phosphor particles are electrophoretically deposited on the conductive surfaces. Different biases are applied to submount 28 and an electrode 82, as indicated by $V_{bias}$. Electrode 82 and all conductive surfaces are immersed in a solution 84 of charged phosphor particles. Although FIG. 4E shows electrode 82 to be physically separate from the container that holds solution 84, electrode 82 includes all means of charging the phosphor particles, and may be integrated with another component, such as the container. Solution 84 may contain a binder material and/or a charging agent in addition to phosphor particles. An exemplary solution 84 may include isopropyl alcohol and water (as a solvent), aluminum nitride as a charging agent and binding agent, and a doped yttrium aluminum garnet compound as phosphor particles. The electric field created by the bias voltages pushes phosphor particles out of solution 84 in the direction shown by arrows 86. Although the phosphor-bearing solution 84 comes in contact with the insulating layers on submount 28 and LED chip 10, phosphor particles deposit only on conductive surfaces. As the electrical contact windows 68 are insulated by photoresist 70 and the submount is insulated by the second insulating layer 66, no phosphor is deposited except on the optical exit surfaces of LED chip 10. After the deposition, photoresist layer 70 is stripped by conventional methods such as oxygen plasma stripping or conventional wet strippers such as acetone, leaving an array of precisely, selectively, and conformally coated phosphor-LED chips.

Figure 5:
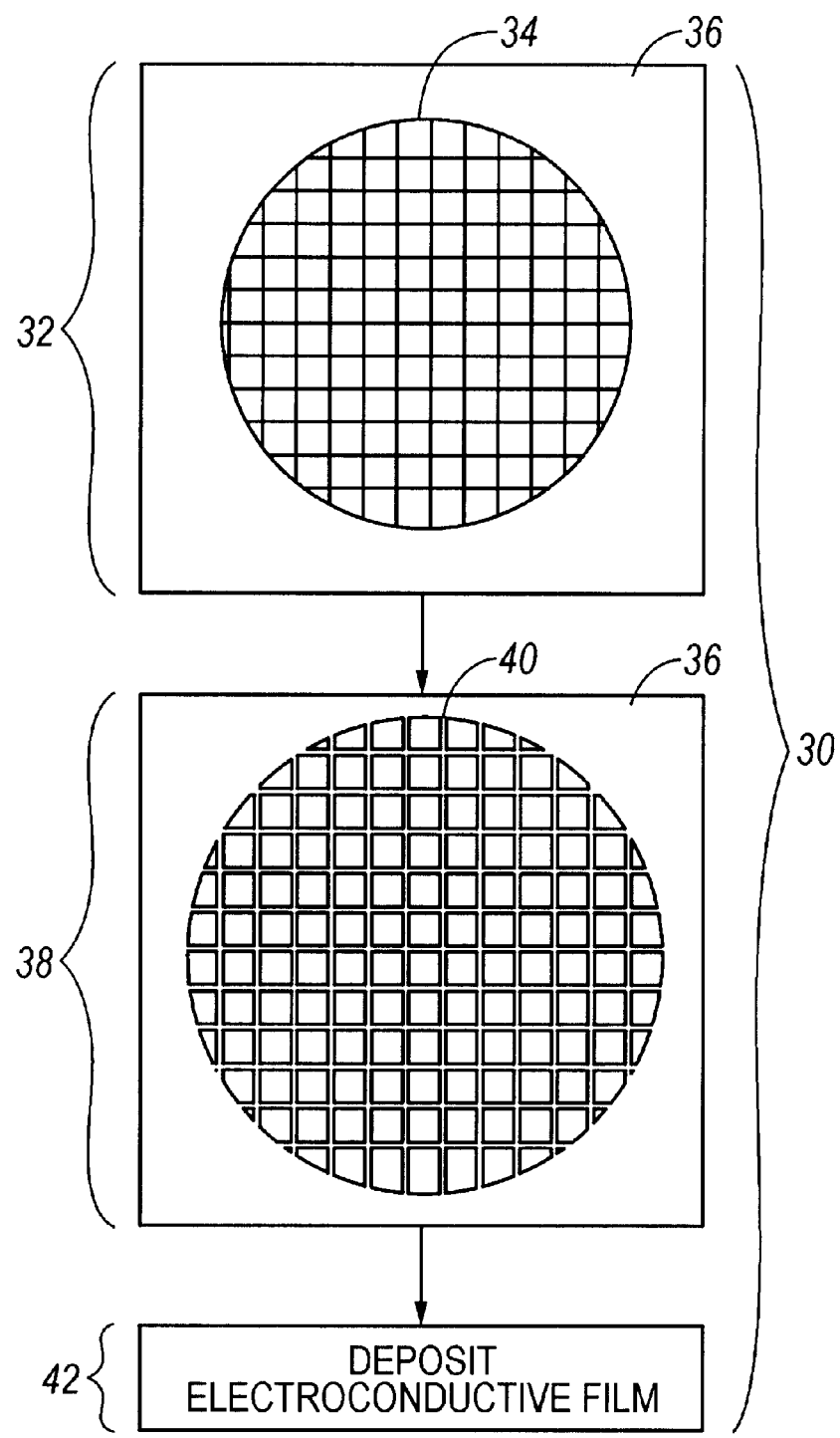
FIG. 5 depicts a process of depositing an electroconductive layer on LEDs made with nonconductive substrate in preparation for the electrophoretic deposition method according to the present invention.

FIG. 5 depicts a process 30 which prepares LED chip 10 having a nonconductive substrate for the electrophoretic phosphor deposition process of the present invention. Process 30 is a separate and independent process from the electrophoretic phosphor deposition process. During stage 32, a wafer 34 consisting of LED dice is mounted on tape 36. Any one of the plurality of chips in wafer 34 may be LED chip 10. In stage 38, the wafer is sawn into individual LED chips, and each LED chip is separated from the neighboring LED chips by a gap 40 while still mounted on tape 36. Gap 40 is big enough to allow coating of all surfaces of LED chip 10 except for the surface adjacent to tape 36. Gap 40 may be less than one tenth of the width of an LED chip. All the exposed surfaces of LED chips on tape 36 are then coated with a mildly conductive material (e.g., R<100 Ω-cm), such as antimony tin oxide, in stage 42. Stage 42 may involve, for example, dipping the chips into an aqueous solution including antimony tin oxide and a surfactant. The mildly conductive material turns into a dry, electroconductive film 88 (see FIG. 6C).

Figure 6A:
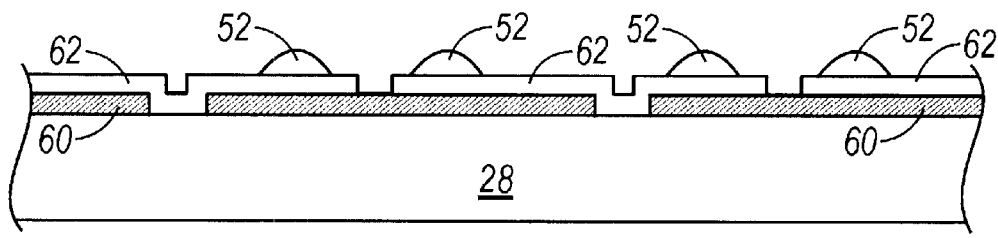
FIG. 6A through FIG. 6E depict an electrophoretic phosphor deposition process involving an LED which includes a nonconductive substrate.
Figure 6B:
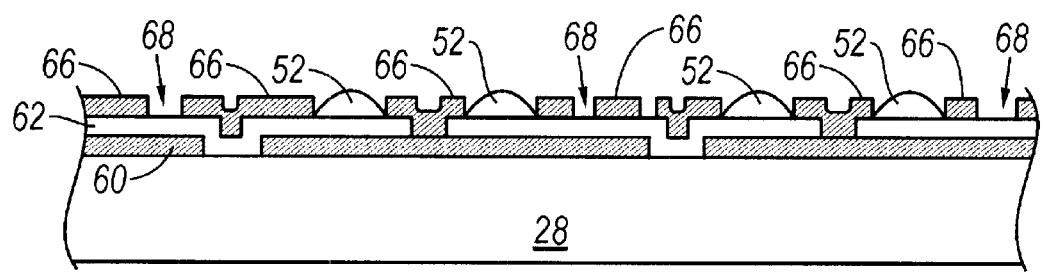

FIG. 6A through FIG. 6E each depict a stage of electrophoretic phosphor deposition process using an LED chip 10 which includes a nonconductive substrate. Regardless of whether LED chip 10 includes a conductive or a nonconductive substrate, the preparation of the submount wafer surface prior to coupling of LED chip 10 is substantially the same. Like FIG. 4A, FIG. 6A depicts coating of submount 28 with an insulating layer 60, depositing contact layer 62 to create cathode and anode contacts, and forming metal bumps 52 on contact layer 62. Like FIG. 4B, FIG. 6B depicts depositing of a second insulating layer 66 in the gaps between anode contacts and cathode contacts and on parts of contact layer 62, forming contact windows 68.

Figure 6C:
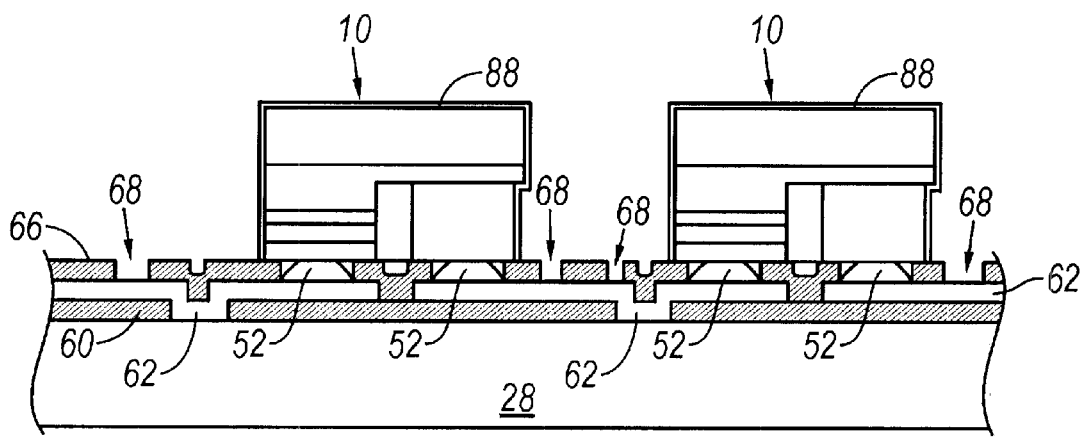

FIG. 6C depicts a stage whereby LED chip 10 is placed on and bonded to metal bumps 52. In contrast to the LED chip with a conductive substrate shown in FIG. 4C, LED chip 10 in FIG. 6C is coated with electroconductive layer 88, for example using process 30 depicted in FIG. 5. As LED chip 10 in FIG. 6C includes a nonconductive substrate, deposition of electroconductive layer 88 effectively converts an LED chip with a nonconductive substrate into a LED chip with a conductive substrate for purposes of electrophoretic phosphor deposition.

Figure 6D:
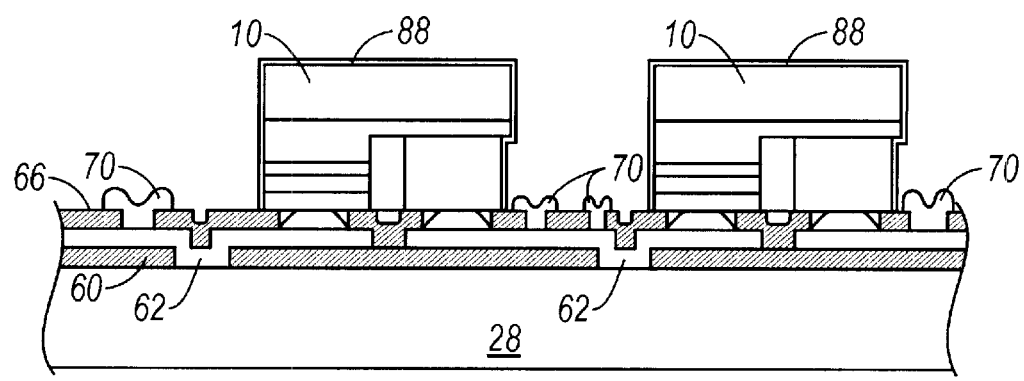

FIG. 6D depicts a stage whereby contact windows 68 coated with insulating photoresist 70 to prevent phosphor from depositing on contact windows 68 during the electrophoresis stage. Insulating photoresist 70 is initially deposited on contact windows 68 and second insulating layer 66. Optionally, a patterned mask may be used to selectively clear the photoresist from some parts of the surfaces, leaving photoresist 70 only on contact windows 68. Alternatively, a mask of a different pattern may be used to clear only the photoresist covering electroconductive layer 88, leaving both second insulating layer 66 and contact windows 68 covered with photoresist 70.

Figure 6E:
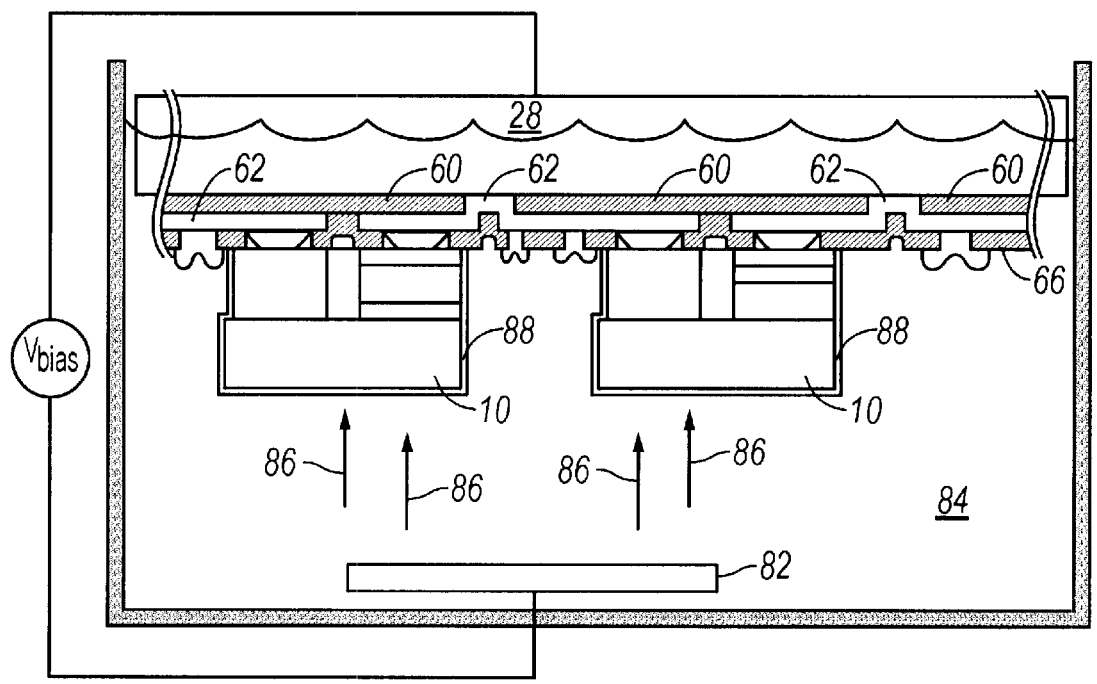

FIG. 6E depicts a stage whereby the conductive surfaces are immersed in solution 84 containing phosphor particles. Different biases are applied to submount 28 and electrode 82, which is submerged in solution 84. As electroconductive layer 88 shares the same bias as submount 28, the bias difference between electrode 82 and electroconductive layer 88 pushes phosphor particles out of solution 84, causing the phosphor particles to deposit as electroconductive layer 88. Arrows 86 indicate the direction in which phosphor particles travel. Substantially all surfaces other than the surfaces coated with electroconductive layer 88 are made nonconductive by second insulating layer 66 or by photoresist 70. As a result, phosphor deposition is restricted to electroconductive layer 88.

Figure 7A:
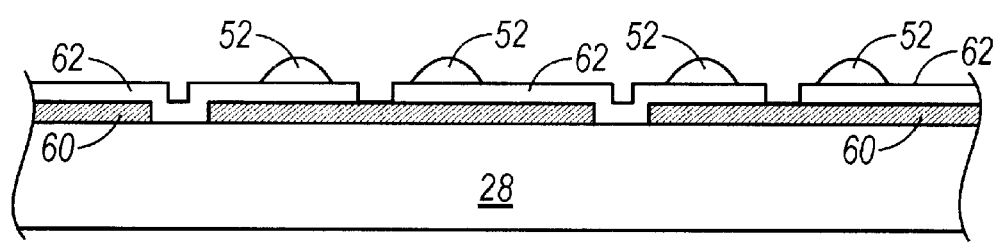
FIG. 7A through FIG. 7F depict an alternative electrophoretic phosphor deposition process involving an LED which includes a nonconductive substrate.
Figure 7B:
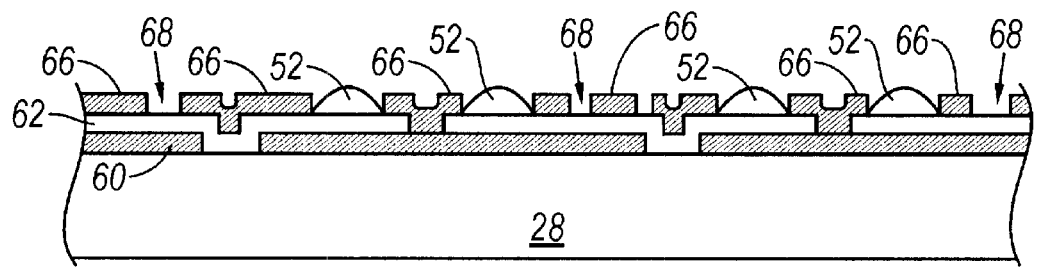
Figure 7C:
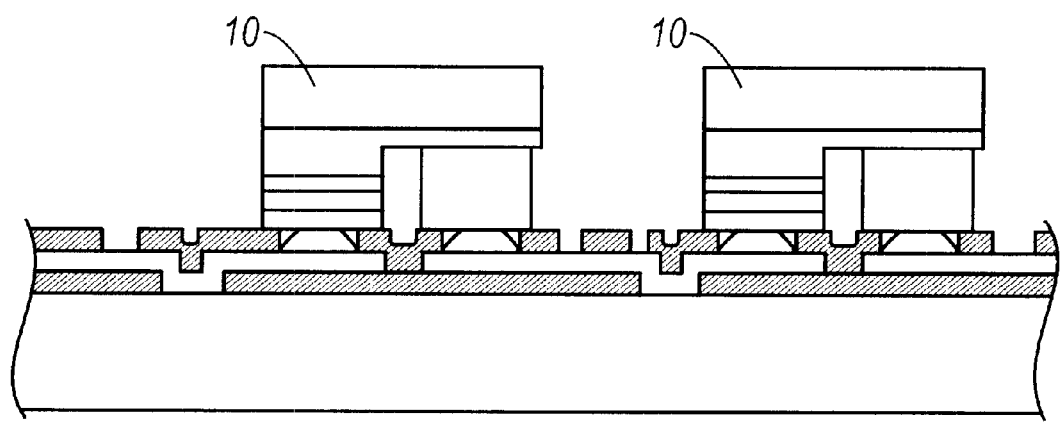

FIG. 7A through FIG. 7F depict an alternative process for electrophoretically depositing a phosphor layer on a LED chip 10 that includes a nonconductive substrate. FIG. 7A, FIG. 7B, and FIG. 7C depict the stages depicted in FIG. 4A, FIG. 4B, and FIG. 4C, respectively. In FIG. 7A, submount 28 is coated with first insulating layer 60, contact layer 62 is deposited on top of first insulating layer 60 to form anode and cathode contacts, and metal bumps 52 are formed on contact layer 62. In FIG. 7B, second insulating layer 66 is deposited on contact layer 62, leaving contact windows 68 exposed. In FIG. 7C, LED chip 10 is placed on and attached to metal bumps 52.

Figure 7D:
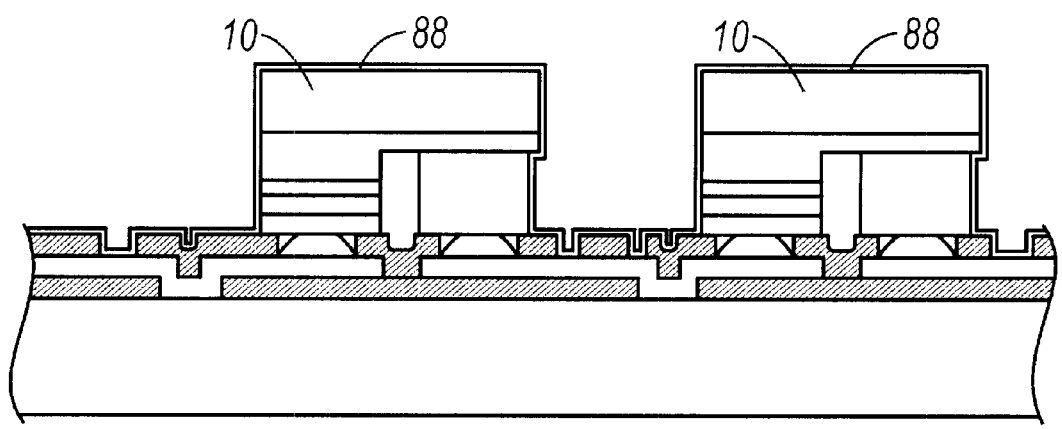

FIG. 7D depicts a stage whereby all surfaces are coated with electroconductive layer 88. In contrast to the stage depicted in FIG. 6C, in which electroconductive layer 88 coated only LED chip 10, electroconductive layer 88 in FIG. 7D coats both LED chip 10 and second insulating layer 66, making all surfaces conductive.

Figure 7E:
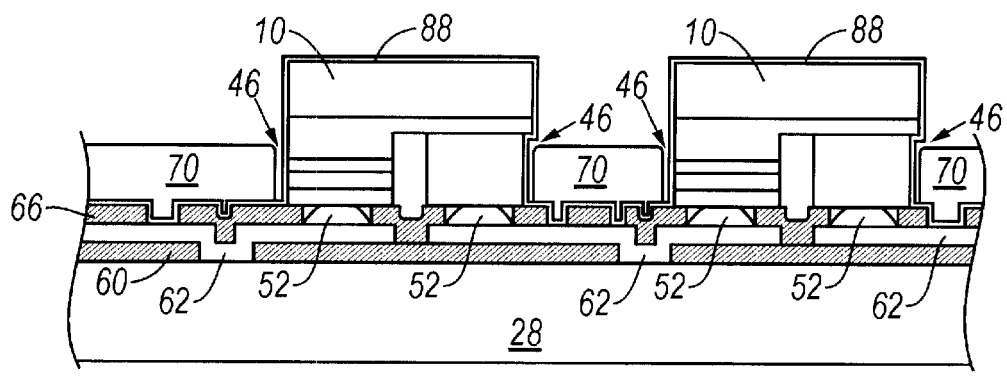

FIG. 7E depicts a selective insulation of electroconductive-layer-coated surfaces where phosphor deposition is not desired. Surfaces where phosphor deposition is not desired may be selectively coated with insulating photoresist 70, for example using a patterned mask. By using the patterned mask, only the surfaces of LED chip 10 may remain conductive, uncoated with photoresist 70. Gap 46 surrounds the side walls of LED chip 10, separating the side walls from photoresist 70 and allowing phosphor deposition on the side walls of LED chip 10. Gap 46 is wide enough to allow phosphor particles to reach the side walls of LED chip 10, but usually less than 100 µm wide.

Figure 7F:
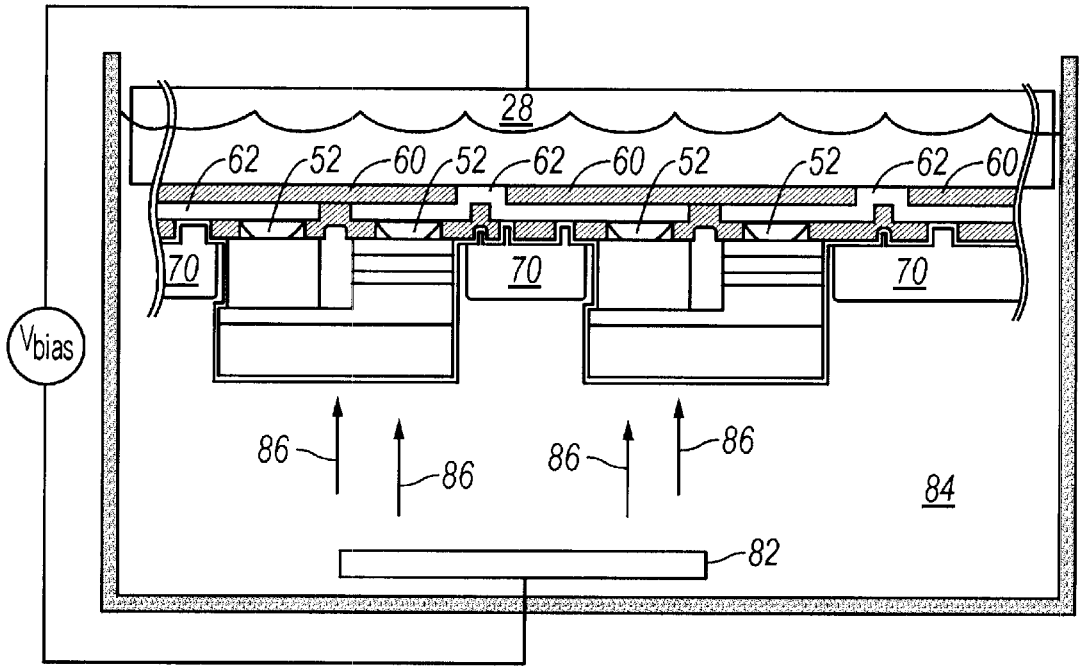

FIG. 7F depicts immersion of all surfaces in solution 84 containing phosphor particles. Different biases are applied to submount 28 and electrode 82, and the difference in biases push phosphor particles out of solution 84 onto electroconductive layer 88, as shown by arrows 86. Gap 46 allows phosphor articles to deposit on the side walls of LED chip 10, conformally coating LED chip 10.

Further details on electrophoretic deposition of a phosphor layer on an LED is provided in pending U.S. application Ser. No. 9/879,547 to William David Collins III titled "Phosphor-Converted Light Emitting Device," which is herein incorporated by reference. However, the electrophoretic deposition disclosed in the above-identified pending U.S. patent application does not lead to selective and conformal coating of LED chip 10 including a nonconductive substrate. Conformal coating can only be achieved if the electrophotographic process in the above-identified U.S. patent application is used in conjunction with photolithography to selectively form conductive and nonconductive regions. A mask patterned to clear just the surfaces of LED chip 10 can be used to ensure that phosphor particles will deposit only on the surfaces of LED chip 10 not coated with an insulating photoresist.

As briefly mentioned above, a transparent binder material may be used to secure the adhesion of phosphor particles onto a surface. In order to enhance the light transmission into and through the phosphor layer, the binder material is selected to have a refractive index of at least 1.4. The transparent binder material may be co-deposited from the electrophoretic solution along with the phosphor powder, or infused into the phosphor matrix by selective deposition and capillary action after the phosphor powder is deposited. The binder material may be an organic material such as an optical coupling epoxy (e.g., PT 1002 from Pacific Polymer Technology), an optical coupling silicone (e.g., silicone supplied by Nye Lubricants), inorganic metal oxide of glass frit powder (e.g., a PbO-based glass), or sol-gel. Further details on the binder material is provided in U.S. Pat. No. 6,180,029 to Mark J. Hampden-Smith, et al. titled "Oxygen-containing Phosphor Powders, Method for Making Phosphor Powders and Devices Incorporating the Same," which is herein incorporated by reference. U.S. patent application Ser. No. 09/879,548 discusses using sol-gel as a binder material, and is herein incorporated by reference.

Figure 8A:
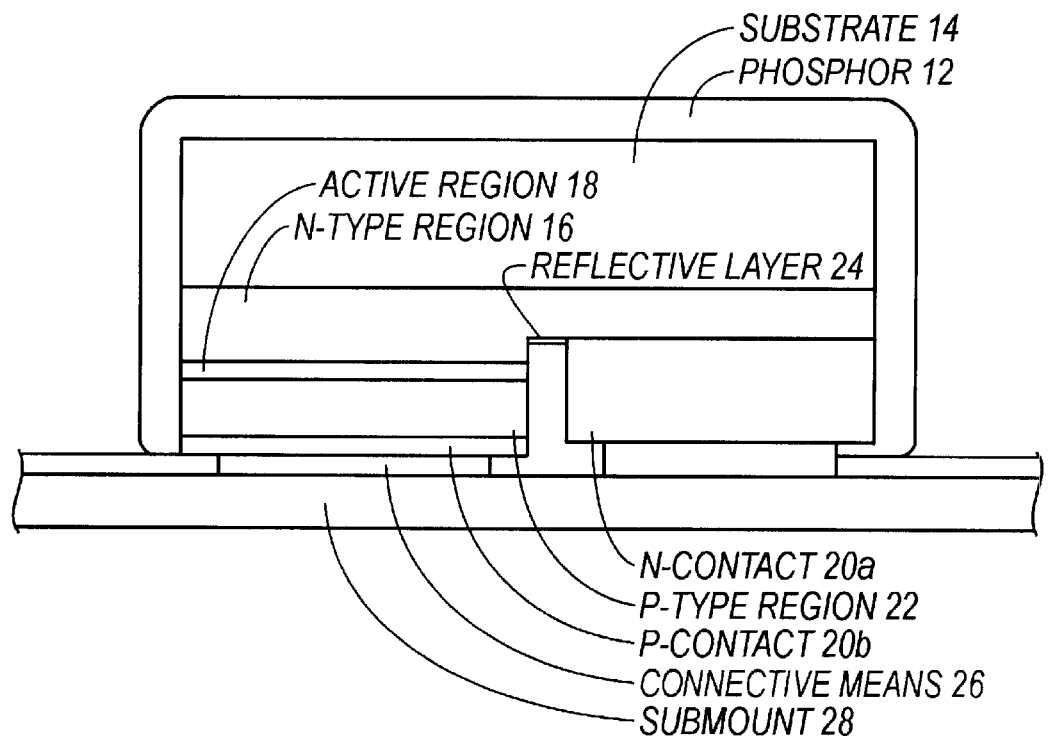
FIG. 8A depicts an LED with a conductive substrate which is conformally coated with a phosphor layer according to the present invention.

FIG. 8A shows a light emitting device including LED chip 10 and a conformal phosphor layer 12. Absence of electroconductive layer 88 indicates that the particular LED chip 10 includes a conductive substrate, and that phosphor layer 12 was created by the process depicted in FIG. 4A through FIG. 4E. Phosphor layer 12 has a substantially uniform thickness above the top surface and is adjacent to all surfaces of LED chip 10 except the surface that is attached to submount 28. In one embodiment, any variations in the thickness of phosphor layer 12 are less than 10% of the thickness of phosphor layer 12, and typically less than 5% of the thickness of phosphor layer 12. Thus, every light path out of phosphor layer 12 has substantially the same length, reducing nonuniformity in the color of light emitted from the source. The thickness of phosphor layer 12 is about 15 µm to about 100 µm.

Figure 8B:
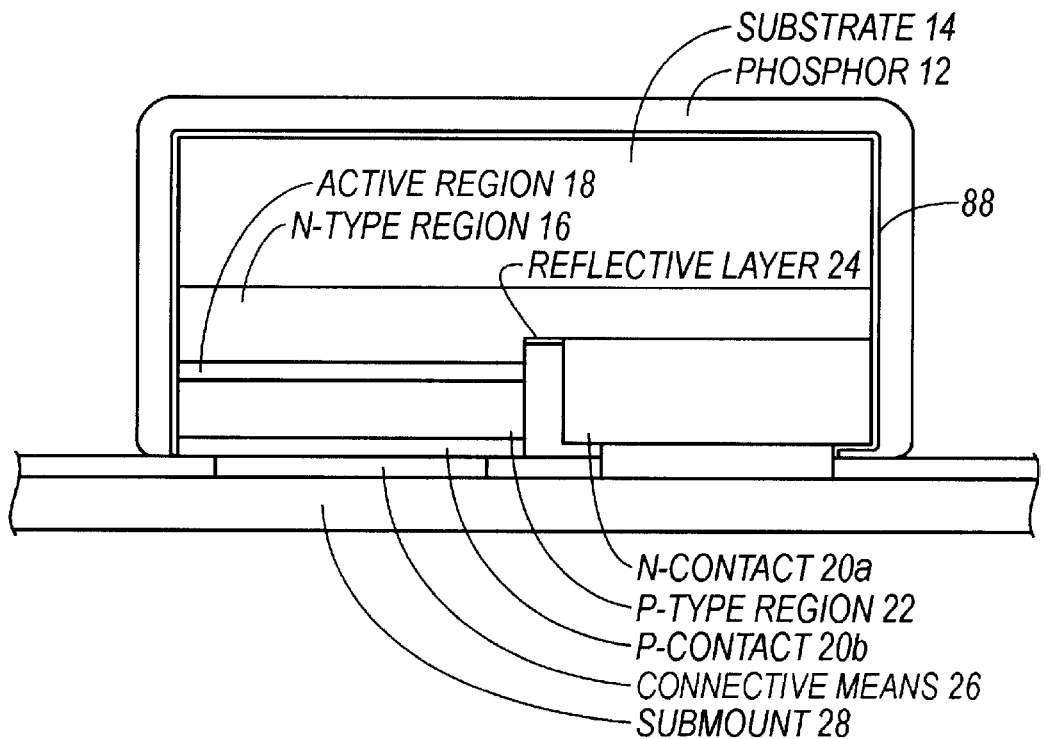
FIG. 8B depicts an LED with a nonconductive substrate which is conformally coated with a phosphor layer according to the present invention.

FIG. 8B depicts a light emitting device created either by the process depicted in FIG. 6A through 6E or by the process depicted in FIG. 7A through 7F. The light emitting device depicted in FIG. 8B includes electroconductive layer 88 in addition to LED chip 10 with a nonconductive substrate and phosphor layer 12, unlike the light emitting device in FIG. 8A. If a binder material is infused into the phosphor layer after the phosphor powder is deposited, there may be an extra binder layer coating phosphor layer 12.

Phosphor layer 12 is close enough to LED chip 10 that it does not significantly increase the size of the light emitting device over the size of LED chip 10. Typically, phosphor layer 12 is adjacent to LED chip 10. In one embodiment, the thickness of phosphor layer 12 is less than 10% of a cross sectional dimension of the LED, e.g., the length of the LED. A typical cross sectional dimension of LED chip 10 is 1 mm. Thus, a phosphor-coated LED according to embodiments of the present invention does not require optics substantially larger than optics required to control the light out of an LED that is not phosphor coated. A person of ordinary skill would understand to adjust the density of phosphor layer 12 as appropriate for the particular type of light emitting semiconductor structure and phosphor particles being used. For example, phosphor layer 12 may include a closely-packed particle layer in order to achieve a thin layer. Multiple phosphors or particles such as titanium dioxide or silicon dioxide may be used to modify the density of phosphor layer 12.

In order to maintain a substantial uniformity of the path length through the phosphor, and therefore of the color of light emitted from the source, phosphor layer 12 should be the only phosphor path through which light from the LED passes. Any phosphor coatings on submount 28, or on any optics such as reflector cups or reflecting planes which may extend the phosphor layer by more than either 10% of the cross-sectional dimension of LED chip 10 or by 100 µm beyond the boundaries of the LED chip, are avoided.

In a conformally coated phosphor-converted light emitting device, the exit path length for light through the phosphor layer does not vary by more than 10%, due to the uniform layer thickness. Thus, the output spectrum from all emissive areas of the source is substantially the same. The volume of the light emitting device is larger than the volume of LED chip 10 by only the thickness of the phosphor layer necessary to create the output spectrum. This layer thickness is typically less than 30-microns thick. Furthermore, masking errors do not perturb, to a first order, nor define the emissive phosphor pattern of the source. Thus, very little precision is required for the masking process.

While particular embodiments of the present invention have been shown and described, it will be obvious to those skilled in the art that modifications may be made without departing from the invention in its broader aspects. Therefore, the appended claims are to encompass within their scope all such modifications which fall within the true spirit and scope of this invention.

What is claimed is:

1. A method of conformally coating a light emitting semiconductor structure with phosphor, said method comprising:
   providing a submount having a conductive region;
   electrically coupling a light emitting semiconductor structure to said conductive region;
   applying a first bias voltage to charged phosphor particles in a solution; and
   applying a second bias voltage to said conductive region to induce said phosphor particles to substantially conformally deposit on at least one surface of said light emitting semiconductor structure.

2. The method of claim 1, wherein said light emitting semiconductor structure comprises a conductive substrate.

3. The method of claim 2 wherein said at least one surface comprises said conductive substrate.

4. The method of claim 1, further comprising positioning said solution to allow said phosphor particles to travel from said solution to said conductive region without obstruction.

5. The method of claim 1, further comprising immersing said conductive region and said light emitting semiconductor structure in said solution.

6. The method of claim 1, wherein said forming said conductive region comprises:
   depositing strips of a first layer of insulating material on said submount, said strips separated by gaps;
   forming a conductive cathode layer and a conductive anode layer on said first layer of insulating material and on said gaps, said conductive cathode layer and said conductive anode layer being separated by a window;
   coating said window, said conductive cathode layer, and said conductive anode layer with a second layer of insulating material, leaving uncoated a part of said cathode layer and said anode layer for electric connections; and
   covering said uncoated part with a nonconductive material.

7. The method of claim 6, wherein said coupling comprises:
   forming a conductive connective means on said cathode layer and said anode layer; and
   bonding said light emitting semiconductor structure to said conductive connective means.

8. The method of claim 6, wherein said first layer and said second layer of insulating material comprises at least one of $Al_nO_m$, $SiO_x$, $Si_xN_y$, polyimide, and poly methyl methacrylate.

9. The method of claim 6, wherein said nonconductive material comprises a photoresist.

10. The method of claim 1, wherein said phosphor particles comprise a strontium sulfide compound.

11. The method of claim 1, wherein said phosphor particles comprise a yttrium aluminum garnet compound doped with at least one of gadolinium, cerium, and praseodymium.

12. The method of claim 1, wherein said phosphor particles comprise a strontium thiogallate compound.

13. The method of claim 1, wherein said phosphor particles comprise a polymer containing an organic luminescent dye.

14. The method of claim 1, wherein said phosphor particles are for being activated by light emitted by said light emitting semiconductor structure to produce light of wavelengths that in combination appear white to the human eye.

15. The method of claim 1, wherein said solution comprises a transparent binder material for securing the adhesion of said phosphor particles to said conductive region, said transparent binder material having a refractive index of at least 1.4.

16. The method of claim 1, wherein said solution comprises a charging agent for charging said phosphor particles.

17. The method of claim 1, further comprising infusing a transparent binder material into a matrix of said phosphor particles deposited on said conductive region, said binder material aiding the adhesion of said phosphor particles onto said conductive region and having a refractive index of at least 1.4.

18. The method of claim 1, wherein said light emitting semiconductor structure comprises:
   a nonconductive substrate; and
   a layer of transparent electroconductive material, wherein said electroconductive material is deposited by a method comprising:
      mounting a wafer on a tape;
      cutting said wafer into a plurality of light emitting semiconductor structures;
      separating each of said plurality of light emitting semiconductor structures from a neighboring light emitting semiconductor structure, creating a gap between neighboring light emitting semiconductor structures; and
      depositing said layer of electroconductive material on said plurality of light emitting semiconductor structures.

19. The method of claim 18, wherein the electric conductivity of said layer of electroconductive material is between the electric conductivity of said phosphor particles and the electric conductivity of said light emitting semiconductor structure.

20. The method of claim 18, wherein said electroconductive material comprises antimony tin oxide.

21. The method of claim 18, wherein said layer is about 50 nm in thickness.

22. The method of claim 1, further comprising:
   depositing a layer of electroconductive material on surfaces of said light emitting semiconductor structure and on surfaces of said submount; and
   preventing phosphor deposition on a part of said layer of electroconductive material by coating with a nonconductive material.

23. The method of claim 22, wherein said depositing comprises moistening the surface of said light emitting semiconductor structure with a solution comprising antimony tin oxide.

24. The method of claim 1 wherein said second bias voltage induces said phosphor particles to substantially conformally deposit on a first surface and a second surface of said light emitting semiconductor structure, wherein the first surface is not parallel to the second surface.

25. A method of conformally coating a light emitting semiconductor structure with phosphor, said method comprising:

providing a light emitting semiconductor structure having a first surface and a second surface, the light emitting semiconductor structure having an anode and a cathode connected to a first bias voltage;

applying a second bias voltage to a solution of charged phosphor; and immersing said light emitting semiconductor structure in said solution to substantially conformally coat at least a portion of said first surface and said second surface of said light emitting semiconductor structure with said phosphor particles.

26. The method of claim 25, further comprising forming a layer of conductive material over at least one surface of said light emitting semiconductor structure that is to be coated with said phosphor.

27. The method of claim 25 wherein said first surface and said second surface are substantially perpendicular.

28. The method of claim 25 wherein said first surface is not parallel to said second surface.

* * * * *